United States Patent
Heinemann et al.

(10) Patent No.: US 12,227,070 B2
(45) Date of Patent: Feb. 18, 2025

(54) METHOD FOR DISPLAYING A WARNING MESSAGE

(71) Applicant: Volkswagen Aktiengesellschaft, Wolfsburg (DE)

(72) Inventors: Robert Michael Heinemann, Goslar (DE); Issa Nemati, Hannover (DE); Stefan Karl Samson, Ilsede (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 172 days.

(21) Appl. No.: 17/582,425

(22) Filed: Jan. 24, 2022

(65) Prior Publication Data
US 2022/0144089 A1    May 12, 2022

Related U.S. Application Data

(63) Continuation of application No. PCT/EP2020/070374, filed on Jul. 17, 2020.

(30) Foreign Application Priority Data

Jul. 24, 2019 (DE) ..................... 10 2019 119 969.7

(51) Int. Cl.
*B60K 35/00* (2024.01)
*B60K 35/23* (2024.01)
(Continued)

(52) U.S. Cl.
CPC .............. *B60K 35/00* (2013.01); *B60K 35/23* (2024.01); *B60K 35/26* (2024.01); *B60K 35/28* (2024.01);
(Continued)

(58) Field of Classification Search
CPC ............ B60K 35/00; B60K 2370/1529; B60K 2370/157; B60K 2370/161; B60K 2370/169; B60K 2370/178
See application file for complete search history.

(56) References Cited

U.S. PATENT DOCUMENTS

| 5,568,052 A | 10/1996 | Sway-Tin et al. |
| 8,089,234 B2 | 1/2012 | Takizawa et al. |
| (Continued) | | |

FOREIGN PATENT DOCUMENTS

| CN | 103183033 | * 12/2012 | .............. B60H 1/00 |
| CN | 106394247 A | 2/2017 | |
| (Continued) | | | |

OTHER PUBLICATIONS

International Search Report dated Oct. 16, 2020 in corresponding application PCT/EP2020/070374.
(Continued)

*Primary Examiner* — Hongmin Fan
(74) *Attorney, Agent, or Firm* — Muncy, Geissler, Olds & Lowe, P.C.

(57) ABSTRACT

A method and system for displaying a warning message to warn of insufficient available drive power for use in an electric vehicle, comprising the steps of a detection of measurement values for determining a latest output of an energy storage device of the electric vehicle via a detection unit, a determination of a latest peak output and/or continuous output of the energy storage device on the basis of the detected measurement values via a processing unit, a comparison of the latest peak output and/or continuous output with a threshold value of the peak output and/or continuous output via the processing unit, a display of a warning message by a display when the peak output and/or continuous output falls below the threshold value, wherein the
(Continued)

method is not initiated until an attempt is made to establish driving readiness.

10 Claims, 3 Drawing Sheets

(51) Int. Cl.
 *B60K 35/26* (2024.01)
 *B60K 35/28* (2024.01)
(52) U.S. Cl.
 CPC .. *B60K 2360/161* (2024.01); *B60K 2360/169* (2024.01); *B60K 2360/178* (2024.01)

(56) References Cited

U.S. PATENT DOCUMENTS

| | | | |
|---|---|---|---|
| 9,182,449 | B2 | 11/2015 | Gibbs |
| 10,351,009 | B2 | 7/2019 | Miller et al. |
| 11,260,757 | B2 | 3/2022 | Degand et al. |
| 2010/0268405 | A1 | 10/2010 | Prickarz |
| 2013/0187450 | A1 | 7/2013 | Yamamoto |
| 2017/0254858 | A1 | 9/2017 | Weicker et al. |
| 2018/0244161 | A1 | 8/2018 | Nguyen |

FOREIGN PATENT DOCUMENTS

| | | | | |
|---|---|---|---|---|
| CN | 106741795 A | | 5/2017 | |
| DE | 102010007851 A1 | | 12/2010 | |
| DE | 102013220015 A1 | | 4/2014 | |
| DE | 102013021640 A1 | | 6/2015 | |
| DE | 102017106313 | * | 3/2017 | ............ B60W 10/26 |
| DE | 102017206694 | * | 4/2017 | ............ B60L 15/209 |
| DE | 102017206694 A1 | | 3/2022 | |
| EP | 2535221 A1 | | 12/2012 | |
| JP | H0374102 A | | 3/1991 | |
| JP | H05111111 A | | 4/1993 | |
| JP | 2007295700 A | | 11/2007 | |
| JP | 2009126258 A | | 6/2009 | |
| JP | 2013163434 A | | 8/2013 | |
| JP | 2013184519 A | | 9/2013 | |
| JP | 2015118789 A | | 6/2015 | |
| JP | 2017013726 A | | 1/2017 | |
| JP | 2021003984 | * | 6/2019 | ............ B60W 20/20 |
| WO | WO2009043640 A1 | | 4/2009 | |

OTHER PUBLICATIONS

International Preliminary Report on Patentability dated Jan. 25, 2022 in corresponding application PCT/EP2020/070374.

Commision delegated regulation (EU) No. Mar. 2014 of Oct. 24, 2013—Official Journal of the European Union.

Japanese Office Action dated Nov. 25, 2022 in corresponding application 2022-503811.

Office Action for Chinese Patent Application No. 202080051058.2 dated Jun. 21, 2024.

* cited by examiner

METHOD FOR DISPLAYING A WARNING MESSAGE

This nonprovisional application is a continuation of International Application No. PCT/EP2020/070374, which was filed on Jul. 17, 2020, and which claims priority to German Patent Application No. 10 2019 119 969.7, which was filed in Germany on Jul. 24, 2019, and which are both herein incorporated by reference.

BACKGROUND OF THE INVENTION

Field of the Invention

The present invention relates to a method as well as a system for displaying a warning message to warn of insufficient available drive power for use in an electric vehicle. In addition, the invention relates to a motor vehicle having a generic system.

Description of the Background Art

The driving performance of an electric vehicle depends substantially on the cell chemistry of the high-voltage batteries used and the temperature. With regard to the output of high-voltage batteries, a distinction is made in this context between peak and continuous output, which sometimes can be greatly different at low temperatures and/or low energy content. This battery behavior can be relevant to safety, such as when a driver is entering a highway at low temperatures with a battery having low charge. For this reason, it is useful to warn a driver accordingly of such situations.

Methods and systems for observing and monitoring the state, in particular the capacity, of vehicle batteries are known from the prior art, for example from DE 10 2013 220 015 A1 (which corresponds to US 2014/0103933) and US 2017/0254858 A1.

DE 10 2013 220 015 A1 relates to a system and a method for estimating the available capacity of a battery element in a vehicle.

US 2017/0254858 A1 relates to a system and a method for monitoring and controlling the state of a battery.

The systems and methods for monitoring a state of a vehicle battery known from the prior art do indeed display warnings when critical battery states are detected, but only the battery states themselves are monitored according to the known methods and systems, and not, for instance, an available drive power attributable to the battery states, so that frequently an available drive power is not determined sufficiently precisely. In addition, known methods and systems for warning of a detected critical battery state are employed exclusively over the long term, and not only as needed, so that in some cases a driver is needlessly badgered with warning messages.

SUMMARY OF THE INVENTION

It is therefore an object of the present invention to at least partially remedy the above-described disadvantages of a method or of a system for displaying a warning message to warn of insufficient available drive power for use in an electric vehicle; in particular, it is the object of the present invention to provide a method as well as a system for warning of insufficient available drive power that guarantee an effective and simultaneously user-friendly warning of insufficient available drive power in an especially simple and economical manner.

It is noted that technical features that are disclosed for the method according to the invention also apply in connection with the system according to the invention and vice versa, so mutual reference always is or can be made with regard to the disclosure of the individual aspects of the invention.

The instant method for displaying a warning message can, for example, be used in vehicles that are at least partially electrically driven, such as hybrid vehicles, or in entirely electrically driven vehicles. In addition to a use in motor vehicles, such as passenger vehicles or trucks, the instant method in this case can also be used in commercial vehicles, ships, or flying objects. The method according to the invention for displaying a warning message to warn of insufficient available drive power for use in an electric vehicle in this case includes the steps of a detection of measurement values for determining a latest output of an energy storage device of the electric vehicle via a detection unit, a determination of a latest peak output and/or continuous output of the energy storage device on the basis of the detected measurement values via a processing unit, a comparison of the latest peak output and/or continuous output with a threshold value of the peak output and/or continuous output via the processing unit, and a display of a warning message by a display when the peak output and/or continuous output falls below the threshold value, wherein the method is not initiated until an attempt is made to establish driving readiness.

A peak output can be understood within the scope of the invention to be, for example, a maximally achievable instantaneous power, which preferably can be provided for a short time interval of 1 to 30 seconds. A continuous output can be understood within the scope of the invention to be, in particular, a maximally achievable long-term output, which preferably can be provided for a significantly longer time interval of minutes to hours. According to the invention, moreover, a threshold value can be understood to be a specified or specifiable value of a peak output and continuous output, which can be specified such that, for example, a vehicle in which the instant method is being carried out can still drive a certain minimum distance, for example can at least maneuver or can reach a charging station. Finally, an attempt to establish driving readiness can be understood within the scope of the invention to be, in particular, a process in which a driving operation is to be initiated. Such a process accordingly preferably differs from a mere starting of a vehicle in which a vehicle is not to move. In this context, the establishment of a driving readiness should preferably be the criterion or the necessary condition for the method according to the invention to be carried out at all. An instant determination of a latest peak output and/or continuous output of the energy storage device on the basis of the detected measurement values via a processing unit can in this case preferably include the preliminary processing of the detected measurement values. This can include, for example, a mere averaging or weighting of individual measurement values, but can also take place in the form of complex data analysis methods.

It has been discovered that, on account of the warning of insufficient available drive power provided in the instant case, in particular because the method is not initiated until an attempt is made to establish driving readiness, an especially user-friendly warning of insufficient available drive power is guaranteed in that the driver is not disturbed by warning messages during a charging process or a simple startup of the engine without the intent to initiate a driving operation. On account of the steps for determination of insufficient available drive power provided in the instant case, moreover, whether or not a driving operation can still be performed is checked in an especially reliable manner so that in this way a warning only takes place when needed.

For the purposes of a simple and simultaneously as exact as possible determination of a latest output of an energy storage device, provision can advantageously be made in the instant case that, in particular, the detection of measurement values for determining a latest output of an energy storage device includes the detection of a latest voltage and/or of a latest current and/or of a latest temperature and/or of a latest state of charge and/or of a latest component temperature and/or of a latest energy content. In addition, allowance can also be made for additional parameters, such as, e.g., the age of the energy storage device or the like. For the purposes of a method that is especially flexibly adaptable, moreover, individual parameters, such as, e.g., the latest voltage and/or the latest current, can always be determined, whereas other parameters, such as the latest temperature or the like, can be determined only when needed, for example once a certain threshold value has been reached.

With regard to a warning of insufficient available drive power over the long term, provision can furthermore advantageously be made in the instant case that the method is carried out regularly, at least at some times, during vehicle operation, wherein the method preferably is carried out in specified and/or specifiable periodic intervals so that a warning message is displayed not just during startup, but also during operation, of a vehicle, if the correspondingly defined conditions are met, in particular a peak and/or continuous output falling below a threshold value. The specified and/or specifiable periodic intervals here can be time intervals, for example 500 ms or 5 minutes or the like, but can also be distance intervals of a distance traveled, for example 5 km, 10 km, or the like. According to another variant, it is also possible, for example, to determine anew each time, after a first execution of the method steps according to the invention, after what time interval or after what distance traveled a repeat execution of the instant method steps should occur. In contrast to periodically occurring method steps, individual method steps, as for example the determination of a latest peak output and/or continuous output of the energy storage device in the processing unit, can also take place steadily and continuously.

With regard to an especially efficient and effective warning of insufficient available drive power, provision can advantageously be made in the instant case that the warning message is produced in the form of a visual and/or acoustic signal. A visual warning message can be made here in the form of a warning symbol or a warning text, for example. Alternatively or in addition, other forms of signals, such as vibratory signals or the like, can also be used. For the purposes of an especially effective warning, multiple warning forms, in particular, as for example a visual and acoustic and vibratory warning message, can be combined with one another here.

For the purposes of an especially early and predictive warning of insufficient available drive power, provision can advantageously be made within the scope of the invention that, in addition to a warning message when the peak output and/or continuous output falls below the threshold value, an advance warning also occurs when the value falls below a specified or specifiable multiple of the threshold value, wherein the multiple preferably is at least 1.25 times the threshold value. In this case, it is advantageous if the advance warning differs in type from the warning message. Thus provision can be made, for example, that the advance warning message is represented in the form of a different symbol, a different color, a different intensity, or the like.

Thus it is possible, for example, that an advance warning message is produced in the form of a yellow symbol and the subsequent warning message in the form of a red symbol, or else that the advance warning message is smaller in size than the warning message.

In order to ensure a warning of insufficient available drive power that is as flexible and adaptable as possible, provision can furthermore be made in the instant case that the threshold value is individually adjustable, preferably is specified as a function of an achievable machine speed. The achievable machine speed here can be produced, in particular, in the form of an electric machine speed to be defined. As a result of the determination of an achievable machine speed, it is possible in particular to determine a maximum achievable speed so that the threshold value advantageously can also be accessible at a maximum achievable speed of, e.g., 15 km/h or the like. Similarly, an adaptation of the threshold value to a maximum distance that can be traveled, for example 500 m or several kilometers or the like, can be provided so that it can still be possible as of the warning to reach a charging station or at least to park the vehicle at a chosen location. Furthermore, an adaptation to a maximum incline that can be overcome or the like, for example 5%, can also be provided.

In addition, provision can advantageously be made within the scope of the invention that the issuing of a warning message depends upon additional factors, as for example the drop below a previously defined electric machine speed or the like. Thus it is possible, for example, that a warning message can be issued only when, in addition to the value falling below a peak output and/or a continuous output, there is also a drop below a definable threshold of an electric machine speed of, for example, 4000 RPM (corresponding to approximately 50 km/h).

For the purposes of as exact as possible an estimation of a still-available drive power, it is also possible that the anticipated consumption by accessory loads is taken into account when the threshold value is specified.

So as to be able, in the event of low drive power, to intervene in and influence the remaining available drive power, provision can furthermore advantageously be made according to the invention that a suggested solution is generated during or after a display of a warning message, wherein the suggested solution preferably is a suggestion for generating higher drive power. The suggested solution here can, in particular, include suggestions for adapting an instantaneous energy consumption or also suggestions for adapting the operation of accessory loads. Preferably, for the purposes of a simple embodiment, a suggested solution can also include adapting operation from a first operating mode to a second operating mode. Moreover, it is equally possible that more than two operating modes can be provided.

In addition, the subject matter of the invention is also a system for displaying a warning message to warn of insufficient available drive power for use in an electric vehicle. Here, the system according to the invention includes a detection unit for detection of measurement values for determining a latest output of an energy storage device of the electric vehicle, a processing unit for determination of a latest peak output and/or continuous output of the energy storage device on the basis of the detected measurement values and for comparison of the latest peak output and/or continuous output with a threshold value of the peak output and/or continuous output, as well as a display for display of a warning message when the peak output and/or continuous output falls below the threshold value. The instant detection unit can preferably be integrated in the energy storage device or arranged thereon. In this context, the detection unit can preferably have a sensor unit or sensors for detecting the measurement values for determining a latest output of an energy storage device. The sensors in this case can be arranged directly on the system or, for example, also remotely from the system.

For the purposes of a compact and economical execution of the instant system, provision can furthermore be made in the instant case that the processing unit is produced in the form of an engine control unit. The engine control unit is coupled to the energy storage device in any case, and consequently is already arranged in the vicinity of the energy storage device so that simple and uncomplicated data transmission is possible.

With regard to an easy-to-integrate and simultaneously especially effective warning of low drive power, provision can furthermore advantageously be made in the instant case that the display is produced in the form of an instrument display and/or an instrument cluster and/or a head-up display. An implementation of the instant display element in the form of a capacitive display arranged remotely from the steering wheel or the like is likewise possible. With regard to an especially effective warning, it is additionally possible that several of the stated display forms are used and consequently several display are employed simultaneously within one vehicle.

Furthermore, the subject matter of the invention is also a motor vehicle comprising an above-described system for displaying a warning message to warn of insufficient available drive power.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
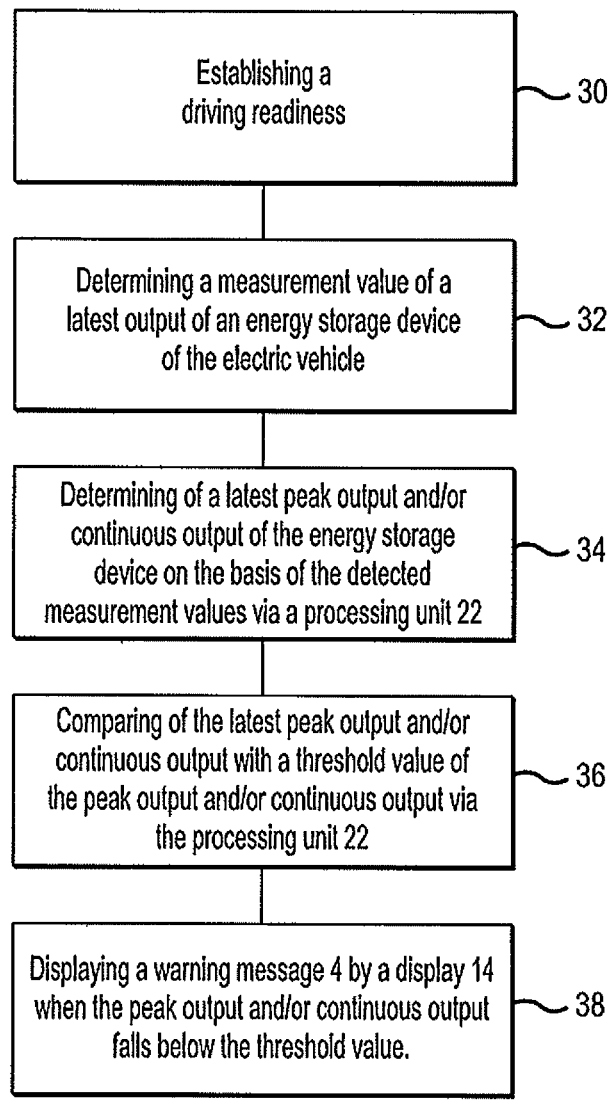
FIG. 1 is a schematic representation of the individual steps of a method according to the invention for displaying a warning message to warn of insufficient available drive power for use in an electric vehicle.

FIG. 1 shows a schematic representation of the individual steps of a method according to an exemplary embodiment of the invention for displaying a warning message 4 to warn of insufficient available drive power.

In this context, the instant method includes the steps of an establishment 30 of a driving readiness as well as the subsequent steps of a detection 32 of measurement values for determining a latest output of an energy storage device of the electric vehicle via a detection unit 24, a determination 34 of a latest peak output and/or continuous output of the energy storage device on the basis of the detected measurement values via a processing unit 22, a comparison 36 of the latest peak output and/or continuous output with a threshold value of the peak output and/or continuous output via the processing unit 22, as well as a display 38 of a warning message 4 by a display 14 when the peak output and/or continuous output falls below the threshold value.

The step of a detection 32 of measurement values for determining a latest output of an energy storage device can include here, in particular, the detection of a latest voltage and/or of a latest current and/or of a latest temperature and/or of a latest state of charge and/or of a latest component temperature and/or of a latest energy content. The warning message 4 displayed according to step 38 can moreover occur in the form of a visual and/or acoustic signal, but also in the form of other signal forms, as for example vibratory signals or the like. Furthermore, multiple warning forms can also be combined with one another for the purposes of an especially effective warning.

The threshold value of the peak output and/or continuous output, which according to step 36 is compared with the latest peak output and/or continuous output, can advantageously be individually adjustable and, for example, be specified as a function of the maximum achievable machine speed or the like. For the purposes of as exact as possible an estimation of a still-available drive power, it is also possible that the anticipated consumption by accessory loads is taken into account when the threshold value is specified.

Figure 2:
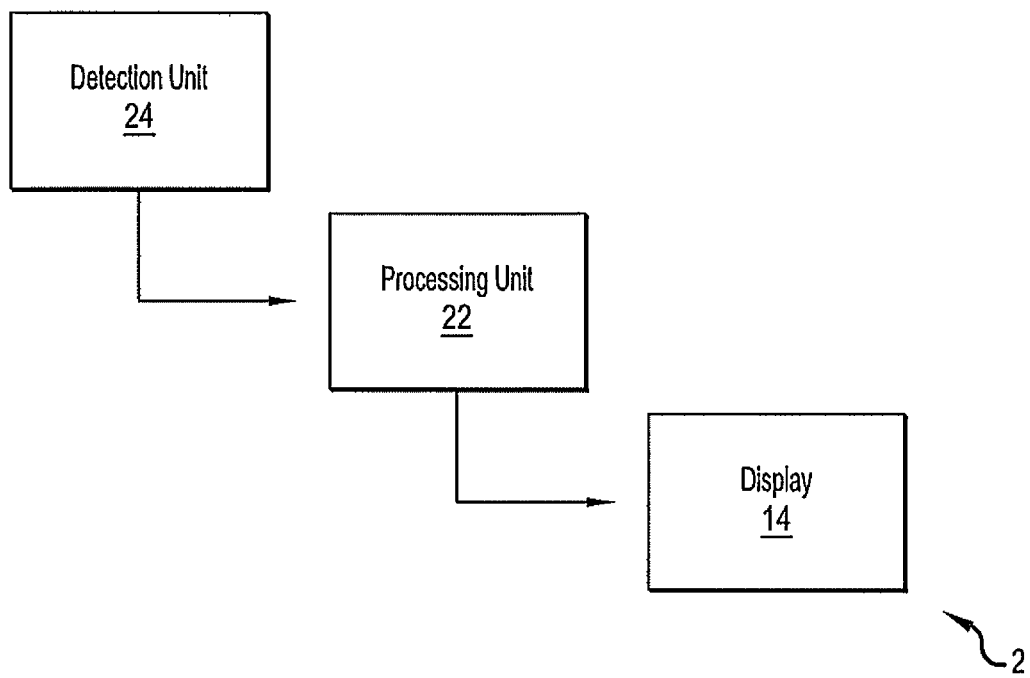
FIG. 2 is a schematic representation of the individual essential components of a system according to the invention for displaying a warning message to warn of insufficient available drive power for use in an electric vehicle.

FIG. 2 shows a schematic representation of the individual essential components of a system 2 according to the invention for displaying a warning message 4 to warn of insufficient available drive power. Here, the instant system 2 includes a detection unit 24 for detection 32 of measurement values for determining a latest output of an energy storage device of the electric vehicle, a processing unit 22 for determination 34 of a latest peak output and/or continuous output of the energy storage device on the basis of the detected measurement values and for comparison 36 of the latest peak output and/or continuous output with a threshold value of the peak output and/or continuous output, as well as a display 14 for display 38 of a warning message 4 when the peak output and/or continuous output falls below the threshold value. For the purposes of the most effective possible exchange of information, the individual components of the instant system 2 can advantageously be connected to one another via a control line. For the purposes of an implementation of the instant system 2 that is as flexible as possible and easy to integrate, the individual components can alternatively also communicate with one another wirelessly or contactlessly using Bluetooth, WLAN, Zigbee, or the like.

For the purposes of a compact and economical implementation of the instant system 2, the processing unit 22 can, in particular, be produced in the form of an engine control unit, which is coupled to the energy storage device in any case, and consequently is already arranged in the vicinity of the energy storage device so that simple and uncomplicated data transmission is possible.

According to the invention, the display 14 can be produced, in particular, in the form of an instrument display and/or an instrument cluster and/or a head-up display or the like. It is likewise possible that the instant display is produced in the form of a capacitive display arranged remotely from the steering wheel or the like. With regard to an especially effective warning, it is additionally possible that several of the stated display forms are used and consequently several display 14 are employed simultaneously within one vehicle.

Figure 3:
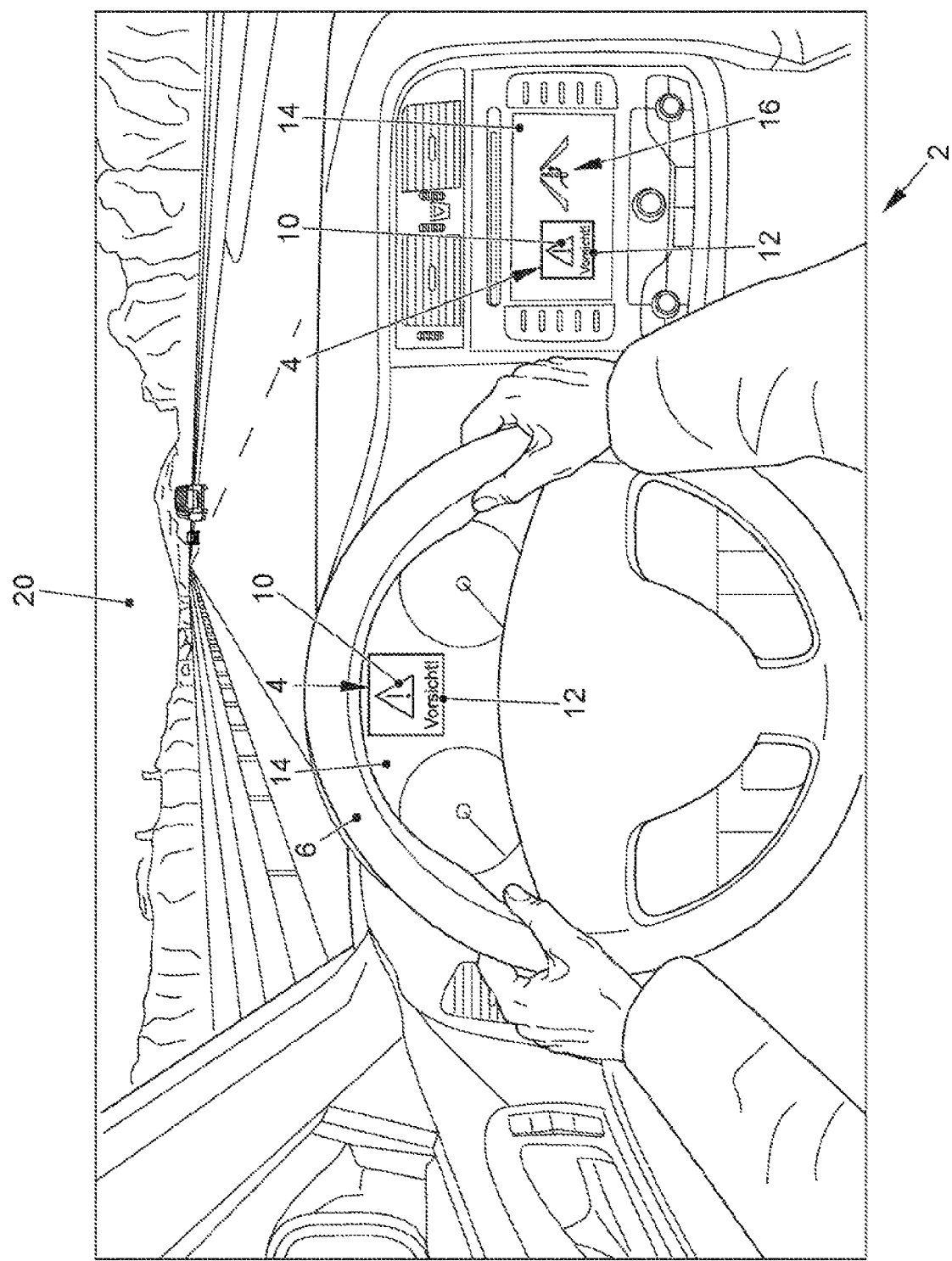
FIG. 3 is a schematic representation of the interior of a motor vehicle in which the method according to the invention for displaying a warning message is carried out.

FIG. 3 shows a schematic representation of the interior of a motor vehicle in which the method according to the invention for displaying a warning message 4 to warn of insufficient available drive power is carried out.

Here, the warning message 4, which in the present case is produced in the form of a warning symbol 10 as well as a warning text 12, is being displayed to a driver both on an instrument cluster arranged in the vicinity of the steering wheel 6 as well as through a capacitive display arranged remotely from the steering wheel 6. On the capacitive display, it can additionally be seen that an additional message 16 is displayed, which can be an additional warning message, for example, or also a suggested solution provided with regard to the warning message 4.

Via the method according to the invention and the system 2 for displaying a warning message 4 to warn of insufficient available drive power, it is possible in particular to allow an especially user-friendly warning of insufficient available drive power in that the driver is not disturbed by warning messages 4 during a charging process or a simple startup of the engine without the intent to initiate a driving operation. On account of the steps for determination of insufficient available drive power provided in the instant case, moreover, whether or not a driving operation can still be performed is checked in an especially reliable manner so that in this way a warning only occurs when needed.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for displaying a warning message to warn of insufficient available drive power for use in an electric vehicle, the method comprising:
    detecting at least one measurement value to determine a latest output of an energy storage device of the electric vehicle via a detection unit;
    determining a latest peak output and/or continuous output of the energy storage device based on the detected at least one measurement value via a processing unit;
    comparing the latest peak output and/or continuous output with a threshold value of the peak output and/or continuous output via the processing unit; and
    displaying a warning message by a display when the peak output and/or continuous output falls below the threshold value,
    wherein the method is not initiated until an attempt is made to establish driving readiness,
    wherein a suggested solution is generated during or after a display of a warning message, and
    wherein the suggested solution is a suggestion for generating higher drive power.

2. The method according to claim 1, wherein the detection of the at least one measurement value for determining a latest output of an energy storage device includes the detection of a latest voltage and/or of a latest current and/or of a latest temperature and/or of a latest state of charge and/or of a latest component temperature and/or of a latest energy content.

3. The method according to claim 1, wherein the method is carried out regularly, at least at some times, during vehicle operation, or wherein the method is carried out in specified and/or specifiable periodic intervals.

4. The method according to claim 1, wherein the warning message is produced in the form of a visual and/or acoustic signal.

5. The method according to claim 1, wherein the threshold value is individually adjustable or is specified as a function of an achievable machine speed.

6. The method according to claim 1, wherein the anticipated consumption by accessory loads is taken into account when the threshold value is specified.

7. A system for displaying a warning message to warn of insufficient available drive power for use in an electric vehicle, the system performing the method according to claim 1, the system comprising:
    a detector to detect measurement values for determining a latest output of an energy storage device of the electric vehicle;
    a processor to determine a latest peak output and/or continuous output of the energy storage device based on the detected measurement values and for comparison of the latest peak output and/or continuous output with a threshold value of the peak output and/or continuous output; and
    a display to display a warning message when the peak output and/or continuous output falls below the threshold value.

8. The system according to claim 7, wherein the processor is an engine control unit.

9. The system according to claim 7, wherein the display is produced in the form of an instrument display and/or an instrument cluster and/or a head-up display.

10. A method for displaying a warning message to warn of insufficient available drive power for use in an electric vehicle, the method comprising:
    detecting at least one measurement value to determine a latest output of an energy storage device of the electric vehicle via a detection unit;
    determining a latest peak output and/or continuous output of the energy storage device based on the detected at least one measurement value via a processing unit;
    comparing the latest peak output and/or continuous output with a threshold value of the peak output and/or continuous output via the processing unit; and
    displaying a warning message by a display when the peak output and/or continuous output falls below the threshold value,
    wherein the method is not initiated until an attempt is made to establish driving readiness; and
    wherein, in addition to a warning message when the peak output and/or continuous output falls below the threshold value, an advance warning also occurs when the value falls below a specified or specifiable multiple of the threshold value, wherein the multiple is at least 1.25 times the threshold value.

* * * * *